United States Patent
Vona et al.

[11] Patent Number: 5,971,591
[45] Date of Patent: Oct. 26, 1999

[54] PROCESS DETECTION SYSTEM FOR PLASMA PROCESS

[75] Inventors: Daniel F. Vona; Kevin S. Gerrish; Kevin P. Nasman, all of Rochester, N.Y.

[73] Assignee: ENI Technologies, Inc., Rochester, N.Y.

[21] Appl. No.: 08/954,387

[22] Filed: Oct. 20, 1997

[51] Int. Cl.[6] .......................... B07C 17/00; G06F 17/00; G06F 7/00; G07F 7/00
[52] U.S. Cl. .................. 364/478.08; 364/478.28; 364/153; 438/710; 219/121.54
[58] Field of Search .................. 364/478.08, 468.28, 364/153; 438/710; 219/121.54

[56] References Cited

U.S. PATENT DOCUMENTS

| | | | |
|---|---|---|---|
| 5,576,629 | 11/1996 | Turner et al. | 324/709 |
| 5,770,922 | 6/1998 | Gerrish et al. | 315/111.21 |
| 5,842,020 | 11/1998 | Faustini | 395/701 |

*Primary Examiner*—William Grant
*Assistant Examiner*—McDieunel Marc
*Attorney, Agent, or Firm*—Bryan Cave LLP

[57] ABSTRACT

Plasma process control arrangement controls a plasma generator that provides electrical power to a plasma chamber for an RF or DC plasma process. A sensor system detects operating parameters of the electrical power, including voltage and current levels. A process detection system (pds) controller has inputs coupled to the sensor system to receive the operating parameters, a programmable memory unit for storing a control program to compute an output control signal based on the operating parameters, and a control output coupled to a control input of the plasma generator. An external computer device, includes a monitor, an icon copying device for example, a mouse suitable for drag-and-drop operation, and a memory storing a suitable code-building program for generating a user-selected control program according to user-determined process requirements. Respective graphical icons are presented on the monitor and are selected and connected by use of the icon copying device to represent logic processing of the operational parameters, and the external computer device creates the corresponding user-selected control program. The user-selected control program is downloaded from the external computer device to the programmable memory of the pds controller, e.g., using standard connectors and cables.

18 Claims, 7 Drawing Sheets

INPUTS:  OPERATORS:  TRIG:  LOGIC:

PHASE

SIN (φ)

$V_{RMS}$

COS (φ)

AND $I_{RMS}$

TAN (φ)

OR $V_{REF} =$

INV $I_{REF} =$ d/dt
$SIN^{-1}(X)$

XOR

TIME

AMP
GAIN=_
$COS^{-1}(X)$

√

PROCESS DETECTION SYSTEM FOR PLASMA PROCESS

BACKGROUND OF THE INVENTION

This invention relates to plasma generation equipment, and is particularly directed to a plasma control arrangement, e.g., for terminating a plasma plating or etching process at a suitable endpoint. The invention is also concerned with controlling the plasma process based on detected operating parameters, for example, the current and voltage in the case of a DC plasma operation, or current, voltage, and phase of radio frequency (RF) electrical power that is being supplied, in the case of an RF plasma operation. The invention is further concerned with a system for adapting the control algorithm according to user-defined requirements.

In a typical RF plasma generator arrangement, a high power RF source produces an RF wave at a preset frequency, i.e., 13.56 MHz, and this is furnished along a power conduit to a plasma chamber. Because there is typically a severe impedance mismatch between the RF power source and the plasma chamber, an impedance matching network is interposed between the two. There are non-linearities in the plasma chamber, and because of these and because of losses in the line and in the impedance matching network, not all of the output power of the RF generator reaches the plasma chamber. Therefore, it is conventional to employ a probe at the power input to the plasma chamber to detect the voltage and current of the RF wave as it enters the plasma chamber. By accurately measuring the voltage and current as close to the chamber as possible, the user of the plasma process can obtain a better indication of the quality of the plasma. In the case of RF plasma, the phase angle is also measured. This in turn yields better control of the etching or deposition characteristics for a silicon wafer or other workpiece in the chamber. By monitoring these parameters, it is possible to determine the process endpoint by applying these parameters to mathematical and signal processing operators. Other observable parameters can be obtained, e.g., radiation from the plasma, values of magnitude error or phase error from the matching network, gas pressure, etc., and these may also be used for process control.

To date, development and implementation of process control algorithms for controlling plasma processes have been handled through either a system controller or an external computer, for example for detection of etch endpoint. This arrangement has the advantage of ease of algorithmic development by the system manufacturer. On the other hand, one major drawback has been slow response time for the system controller, i.e., on the order of several seconds or more. As an analog interface is also required, the system controller is prevented from executing sophisticated algorithms that may be needed for accurate process detection. For this reason, it would be preferable to operate detection and control algorithms in an intelligent sensor, rather than an attached computer, so that response times can be greatly decreased, e.g., on the order of milliseconds.

Another problem with the present-day approach is that the control algorithm is rather inflexible from the user's standpoint, and it is difficult for the user to make adjustments in the process control. As the existing process controller must be factory programmed, it is not possible for the user to make local adjustments in the algorithms. This makes rapid development, testing, storing, and recalling detection algorithms impossible in the current state of the art. Because the detection and control algorithms are highly proprietary to the end user, and often are highly system dependent, it would be preferable for the end user to develop these algorithms independently of the sensor manufacturer.

System controller slowness, and the conventional analog interface, prohibit the system controller from executing more sophisticated algorithms that are necessary for accurate process detection. The preferable implementation would require operation of detection software in an intelligent sensor, where response times can be greatly decreased from current response times, i.e., on the order of milliseconds.

Until quite recently, sensing technology was not available that was capable of intelligent and accurate monitoring of operating parameters, e.g., voltage, current, and phase angle, at the sensor position. This has been achieved in accordance with a system described in U.S. patent appln. Ser. No. 08/684,833, filed Jul. 13, 1996, and which matured into U.S. Pat. No. 5,770,922 issued on Jun. 23, 1998, having a common assignee herewith. Prior implementations of a process detection and control system have required a separate small computer to serve as the "intelligence" of the sensor. For this reason, additional hardware had to be tied permanently to the plasma equipment, and these implementations did not solve the problems of delayed algorithm development and slow response times. Also, because all calculations are handled at the sensor, the need for analog connections to the system controller is eliminated, thus reducing opportunity for imposed noise.

A code-building software package that employs graphic user/design interface has recently appeared. One example of commercial software is sold under the name Matlab Simulink Interface. In this software, graphical icons, or blocks, are manipulated using a computer mouse or similar device to drag-and-drop the icons on the monitor screen of a computer. There is a library of available blocks, which include standard blocks and custom user-designed blocks. The program uses the metaphor of a block diagram to represent a dynamic system. The blocks are copied from the libraries of blocks, and connected so as to form a system, with lines representing the routing of signals from one block to the next. The object-oriented software then builds digital signal processing codes that conform with the algorithm represented by the user-created block diagram. The blocks can represent, e.g., signal generators, filters, oscilloscopes, etc., permitting the user to simulate a desired signal processing environment and to observe its behavior. However, the Matlab Simulink system does not provide for downloading an algorithm or code from the computer into a ROM or other memory device of a process controller.

A plasma monitoring and control system that monitors current, voltage and phase angle of RF plasma power, and determines process end points based on changes in those parameters, is described in Turner et al. U.S. Pat. No. 5,576,629. This system requires a dedicated process control computer. There is no provision for user-programming the computer to effect changes in the process end point detection. This system has to rely on detection of harmonics to achieve any speed in process control. The Turner et al. detection system is also quite complex, as well as cumbersome and expensive. Moreover, there are no means for saving a user-defined algorithm.

OBJECTS AND SUMMARY OF THE INVENTION

It is an object of this invention to improve a DC, RF or other (e.g., kilohertz or microwave range frequencies) plasma process, by improving the response speed of the system controller and by permitting the user to define the process algorithm by which the plasma process is controlled.

It is a more specific object to provide a plasma process control arrangement which enables the end user of the plasma processing system for rapidly developing, testing, storing, and recalling detection algorithms in an intelligent plasma sensor system.

It is a further object to provide such a process control arrangement in which the user of the plasma process can define and create the control algorithms quickly and without special training in software techniques, according to user-determined control criteria.

It is a still further object to provide a process control arrangement that employs a drag-and-drop style graphic user interface (GUI) which allows the user to construct a block diagram of a detection algorithm, which permits the user to download the code representing this algorithm into the sensor for real-time operation, and which contains a real-time graphic test/debug interface permitting the user to probe and evaluate the designed algorithm.

It is a yet further object to employ a sensor having a very high dynamic range (50 dB or greater), with on-board signal processing capable of operating with complex sensing/detecting algorithms.

It is still another object to provide a system with sensor hardware that can send an output signal (analog or digital) to a system controller for process detection, and which can store and recall, on demand, a number of previously developed algorithms.

It is yet another object to provide a process detection arrangement that can be self-contained in a housing or cabinet of small size, or can fit entirely within the sensor cabinetry.

It is still another object to control generator or related equipment directly by means of a screen-displayed algorithm, with or without involving a system controller for the purposes of testing and debugging the screen-displayed algorithm in real time.

In accordance with an aspect of this invention, a plasma process control arrangement is provided for a plasma process, which involve, e.g., DC or RF plasma. A plasma generator provides electrical power to a plasma chamber for conducting the plasma process at a controlled level. The electrical power applied to the plasma chamber has detectable operating parameters including voltage and current levels, and also phase angle in the case of RF plasma. A detection system is interposed between the plasma generator means and the chamber to detect the operating parameters, e.g., RMS voltage, RMS current, and phase angle. A process detection system (PDS.) controller has input means coupled to the detection system to receive said operating parameters from it, a programmable memory unit for storing a control program to determine an output control signal based on these operating parameters, and a control output coupled to a control input of the plasma generator. An external computer device includes a monitor, a drag-and-drop device, i.e., a mouse, trackball, joystick, by way of example, and a memory storing a suitable code-building program for generating a user-selected control program according to user-determined process requirements. The code-building program can be an object-oriented program. The external computer displays respective graphical icons on the monitor, and the user selects from these and connects them on the monitor screen by using the drag-and-drop device. The drag-and-drop device can be any suitable means for copying the icons from the icon library onto the working area of the monitor screen, and connecting input and output nodes of those icons. In this way the user creates a block diagram of the process algorithm to represent logic processing of the operational parameters. The external computer device creates the corresponding user-selected control program. Then, the computer device can download the user-selected control program to the programmable memory of the PDS controller, and the plasma system is ready for testing or use. If any modification of the algorithm is necessary to correct the process, e.g., to change the endpoint of the process, this can be done in a matter of minutes.

Several of these sensing and detection algorithms can be stored in the programmable memory of the PDS controller, and can be used to control respective different plasma process operations, or can be used to control different phases of the same plasma operation, e.g., etching and deposition.

In one of many possible applications, a process engineer may wish to detect the endpoint of an etch operation. The process engineer wishes to de-activate the RF plasma power when an etching process is complete. After some experimentation, the engineer hypothesizes that the best method for determining the endpoint may be detecting when reactive power drops below a threshold level, after a specified time.

According to the current state of the art, if the process engineer wants to verify his theory, he goes to a software engineer for the system controller, and requests the developed algorithm be implemented into the controller software. An analog line is routed from the plasma sensor to the system controller, where it is sampled at a rate of roughly twice per second. After extensive work, the system controller software is installed and is ready for a debug operation. If the implemented algorithm actually works, then the job is complete. However, if the algorithm does not work as desired or if the algorithm needs to be modified, the cycle must be repeated. In addition, there is the possibility of RF noise affecting the analog signal routed from the sensor to the system controller, which can introduce spurious signals. Cycle times for implementation, test and debug can be on the order of months.

According to the process detection system (PDS) of this invention, the engineer can easily test his theory of endpoint detection. The engineer simply creates a block diagram representation of his control algorithm, by dragging and dropping the desired block representations on the computer monitor screen. Then he downloads the process algorithm from the computer to the PDS controller, i.e., into the sensor, where the process algorithm is tested. The process is started, and using real-time graphic debug features of the process detection system, the engineer can monitor the behavior of the algorithm. The engineer can make changes, as need be, on the spot. For example, if he determines that the time prior to algorithm activation is too long by 0.2 seconds, he can change the time criterion on the block diagram, which revises the code generated by the computer. The revised algorithm is then downloaded again into the sensor. The algorithm is permanently saved into the pds memory, and a digital line is routed to the system controller to signal that the endpoint is reached. Cycle time has been reduced to the order of about an hour, and has been accomplished without the involvement of a software specialist or software engineer. In this case, all the necessary tools for creating the code for the PDS controller are contained in the external computer, and permit the user to create the process control algorithm without any special training in software development.

The PDS controller of this invention integrates a graphical algorithm development/debug system into the operating software for the external computer, and thus permits the plasma process control algorithm to be created, and modified, entirely by the end user. In addition, the external computer is needed only for the algorithm development stage, and not for actual industrial plasma processing. Thus, any one such computer can be used with more than one plasma system. In addition, the plasma PDS controller, which can store multiple algorithms for different plasma process applications, permits the end user to select a stored algorithm, as needed, to go from one process to another.

In a preferred implementation, the code-building software is PC compatible, and is written in a "high-level" language, e.g., the language commercially available from Microsoft under the designation Microsoft Visual Basic or Visual C. The software communicates through standard PC interfaces, such as RS-232, for algorithm downloads. The PDS preferred implementation would be used in conjunction with an intelligent plasma sensor, with the following features: (1) on-board Digital Signal Processor (DSP) operating under a multitasking environment which allows the end-user to define the amount of processing dedicated to his/her algorithm; (2) ability to store multiple algorithms permanently, and to recall those algorithms on command; (3) configurable by the end user to power on in a state where the user-selected algorithm is running; and (4) ability to produce an output signal, either analog or digital, which can be used to indicate status to a system controller or other hardware in the system.

The above and many other objects, features, and advantages of this invention will become apparent from the ensuing description of a preferred embodiment, which is to be read in conjunction with the accompanying Drawing:

DETAILED DESCRIPTION OF THE PREFERRED EMBODIMENT

Figure 1:
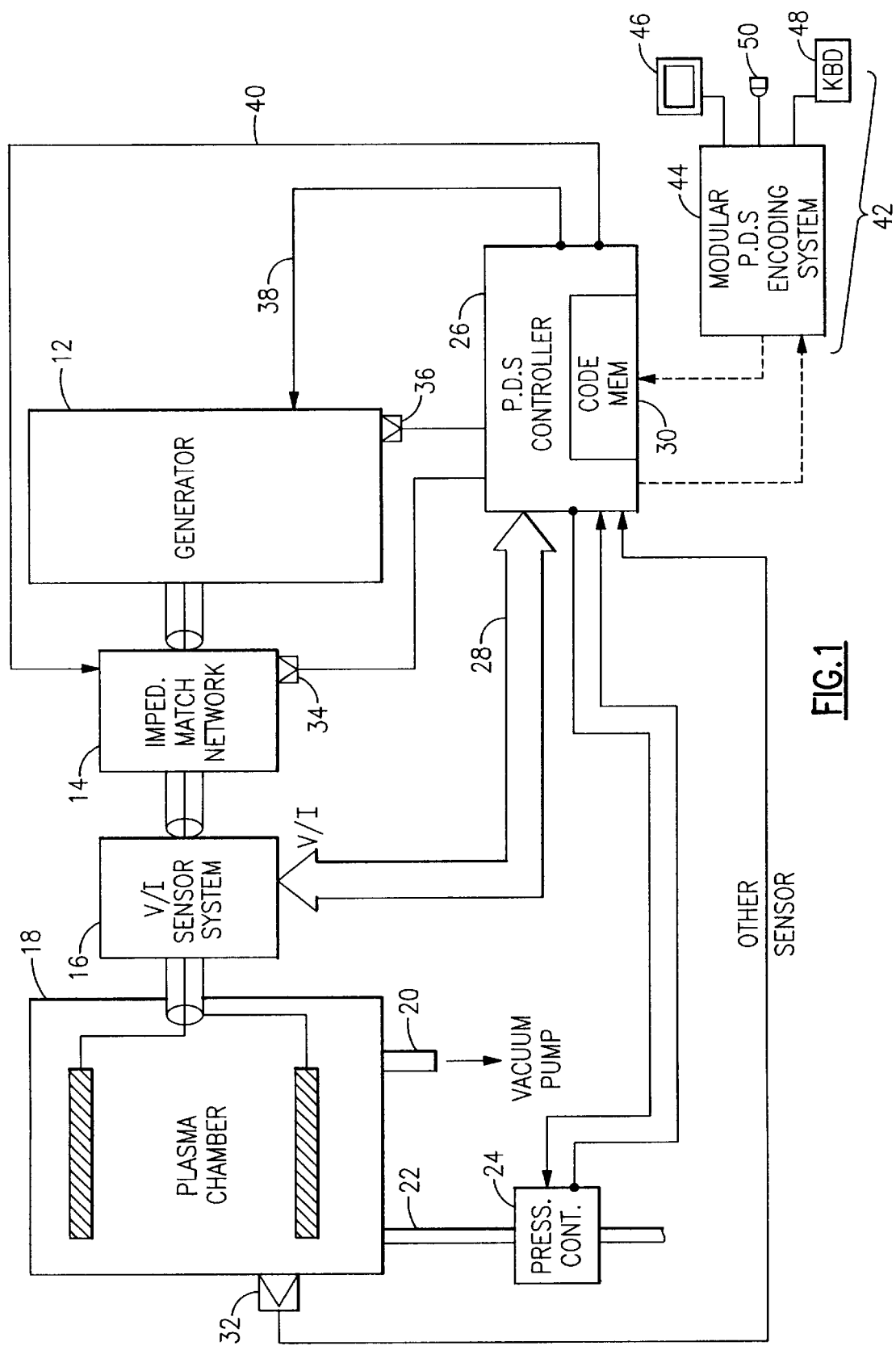
FIG. 1 is a system block diagram of a process control system for a plasma process according one embodiment of this invention.

With reference to the Drawing figures, and initially to FIG. 1, a plasma processing system 10 is shown for purposes of example, and in this case the system 10 is an RF plasma system. A plasma generator 12 provides RF electrical power at a predetermined frequency, i.e., 13.56 MHz. The output of the generator 12 is followed by an impedance matching network 14, which supplies the electrical power through a voltage/current sensor system 16 to an input of a plasma chamber 18. A vacuum connection 20 leads from the plasma chamber 18 to a vacuum pump (not shown), and a gas inlet 22 is connected to a supply (not shown) of gas, usually including argon, or mixture of gases. A gas pressure controller 24 is connected in line with the gas inlet 22, and serves both to regulate the gas pressure and to sense gas pressure in the plasma chamber.

A process detection system controller, or PDS controller 26 controls the plasma process in response to various sensor inputs. This PDS controller can be a separate unit, but may also be incorporated into the housing of the V/I sensor system 16. A signal bus 28 connects the sensor 16 with an input of the pds controller 26 to carry signals conveying voltage, current, phase, or other operating parameters of the electrical power that is being applied to the plasma chamber 26.

The operating codes, including the process control algorithm(s) for the plasma process, are stored in a memory device 30 of the PDS controller 26. This device 30 can be an erasable programmable read-only memory, such as an E-PROM, capable of storing downloaded program codes.

An additional sensor 32 coupled to the pds controller 26 is disposed on the plasma chamber 18, and may be, for example, an optical sensor responsive to visible wavelengths associated with plasma glow. Another sensor (or sensors) 34 is associated with the match network 14, and may provide information of capacitor tuning position, phase error, or magnitude error. A sensor 36 associated with the plasma generator 12 may provide information on forward voltage or forward current, or applied power. An output 38 of the PDS controller 26 is coupled to a control terminal of the plasma generator; and another output 40 of the PDS controller 26 leads to a control terminal of the impedance match network 14. These sensors and outputs are intended to illustrate the sensing and control of various possible operating parameters and variables. Many others in addition to those discussed here would be possible.

Figure 2:
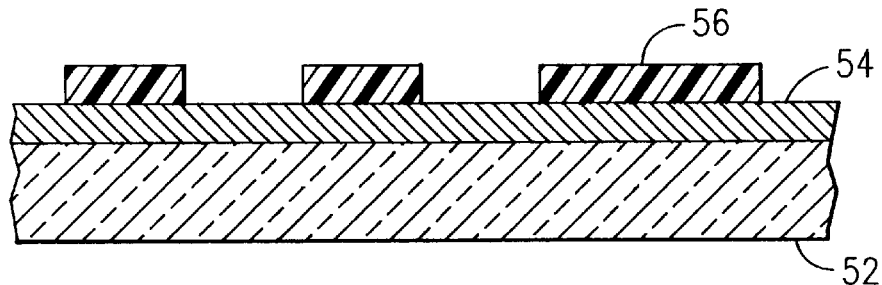
FIGS. 2 and 3 are schematic cross sections of a substrate and coatings for describing an etching process of this invention.
Figure 3:
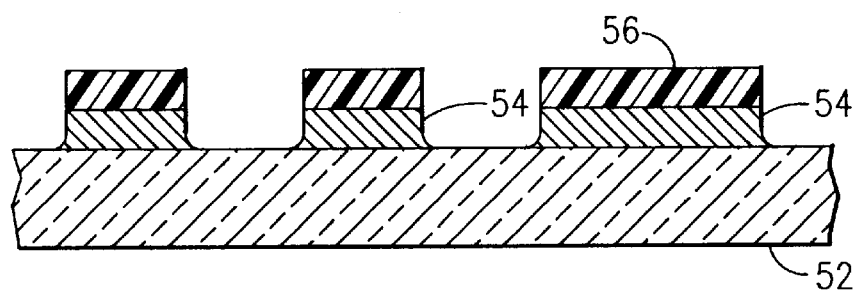

An external computer 42, which can be a small personal computer (PC), notebook, or laptop, has installed a modular PDS encoding system 44 to implement the desired algorithm in the PDS controller 26. The external computer also has a monitor 46, a keyboard 48, and a mouse or other similar device 50, as well as other conventional peripheral devices (not shown). The computer 42 is coupled to the pds controller 26 using standard cables and connectors, although this could be easily carried out using infrared coupling or other wireless connections. to The process according to the present invention can be explained with reference to FIGS. 2 and 3. Here a silicon wafer or substrate 52 has an aluminum coating 54 applied over its entire front surface. A photo resist mask 56 covers selected portions of the aluminum coating 54 with lands defining the positions of electrodes and conductors, and the spaces between lands defining positions where the metallization is to be removed. Here, the aluminum metal is to be etched away. The aluminum is subjected to plasma etching operation which removes the aluminum metallization between the lands of the photo resist 56 to expose the silicon, as shown in FIG. 3. The etch operation should remove all the aluminum, but should not continue and remove silicon. The process control monitors the operating parameters of the plasma etch and detects a plasma etch end point based on changes in those parameters.

Figure 4:
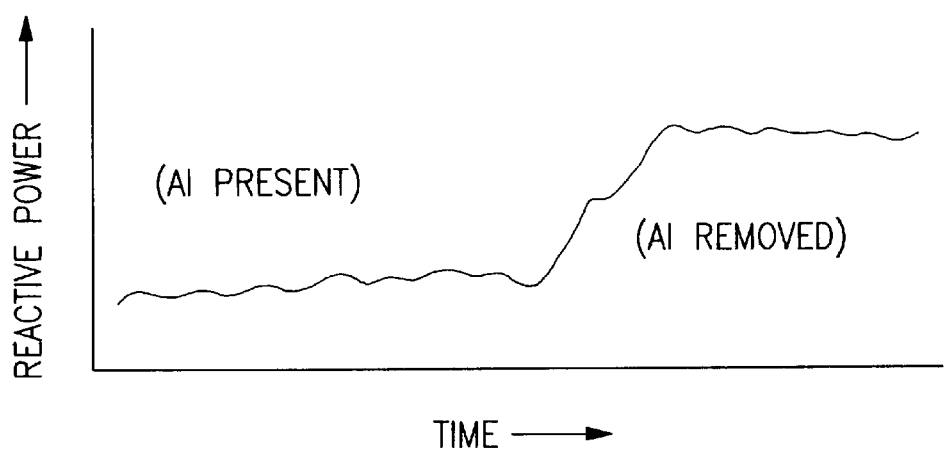
FIG. 4 is a graph showing time changes in one operating parameter of the plasma system of FIG. 1.

FIG. 4 is a chart of reactive power versus operating time, which indicates a possible implementation of this invention. Here, changes in the reactive power are monitored to detect an end point. The reactive component of power changes over time as the aluminum is etched away, and changes from an initial level to a final level, the final level corresponding to completion of the etching phase. The reactive power is the "imaginary" component of complex RF applied power, and can be obtained from the (rms) voltage $V_{rms}$, the (rms)

current $I_{rms}$, and phase angle $\Phi$ between voltage and current, to wit, Reactive Power=$V_{rms}*I_{rms}*SIN(\Phi)$. To avoid a false reading, the process should continue for at least some minimum time, corresponding to the lower knee on the chart. To use this as an end point detection system, the user creates an algorithm in which an endpoint corresponds to reactive power reaching or exceeding at least a predetermined threshold, provided some minimum time threshold has been exceeded. This is a simple and rather straightforward algorithm, and to apply this algorithm, the user selects from a library of graphic icons, as shown in FIG. 5.

Figure 5:
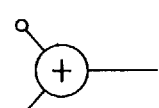
FIG. 5 shows a portion of a library of graphic icons employed in one embodiment of this invention.
Figure 5:
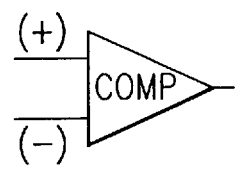
Figure 5:
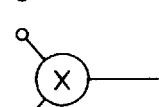
Figure 5:
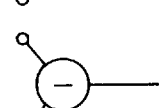
Figure 5:
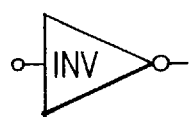
Figure 5:
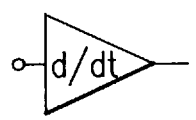
Figure 5:
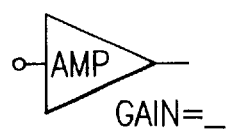
Figure 5:
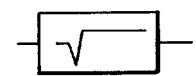

The modular encoding system 44 includes a graphic user interface that comprises a library of icons, a portion of which is shown in FIG. 5. These icons are presented on the screen of the monitor 46, and the user can point and click the mouse 50 to drag and drop these icons. The icons are moved and copied to a work area on the screen to build a logic circuit diagram. FIG. 5, shows only a portion of all possible icons, including a number of possible inputs, such as phase angle $\Phi$, voltage $V_{rms}$, current $I_{rms}$, reference voltage $V_{ref}$, reference current $I_{ref}$, elapsed time T; arithmetic operators, including addition, multiplication, subtraction, inversion, time differentiation, amplification by set table gain, and root. Also shown are trigonometric functions, Sin $\Phi$, Cos $\Phi$, Tan $\Phi$, arcsin x, and arccos x, and various logic operators, namely, comparator, AND gate, OR gate, and Exclusive Or gate. While not shown here, additional inputs could include, forward power, reflected power, reactive power, standing wave ratio or SWR, reflection coefficient, impedance magnitude, complex impedance, and V/I probe status (alarm conditions, etc.). Other inputs could include matching network capacitor 1 position, matching network capacitor 2 position, matching network phase error, matching network magnitude error, matching network status (alarms, etc.), other matching network sensors, generator forward power, generator reverse power, generator frequency (for frequency tuning generators), harmonic levels, generator setpoint, generator status (alarms, etc.) and other sensor inputs. Additional arithmetic operators may include division, integration, arbitrary power ($X^N$), natural logarithm, (Ln), logarithm (base 10), and exp(x). Additional trigonometric functions can include cotangent, arc tangent, hyperbolic sine, hyperbolic cosine, and hyperbolic tangent. Other operators may include high-pass filter (HPF), low-pass filter (LPF), band-pass filter (BPF), band stop filter (BSF), generic finite impulse response filter (FIR), generic infinite impulse response filter (IIR), Fast Fourier Transform (FFT), Inverse Fast Fourier Transform (IFFT), convolution, and correlation. Logic operators can also include a NOT (logic inverter), a One-Shot (Edge triggered device), J–K flip-flop, and D flip-flop. Outputs can include Analog Output, Digital Output, Comm Output (for communications output via a serial link), Word Memory (to save a value), or Flag Memory (to save a flag or bit). The foregoing is not intended to be an exhaustive listing of possible icons or operators; rather the list can include may more possibilities, which would be too numerous to list here.

Figure 6:
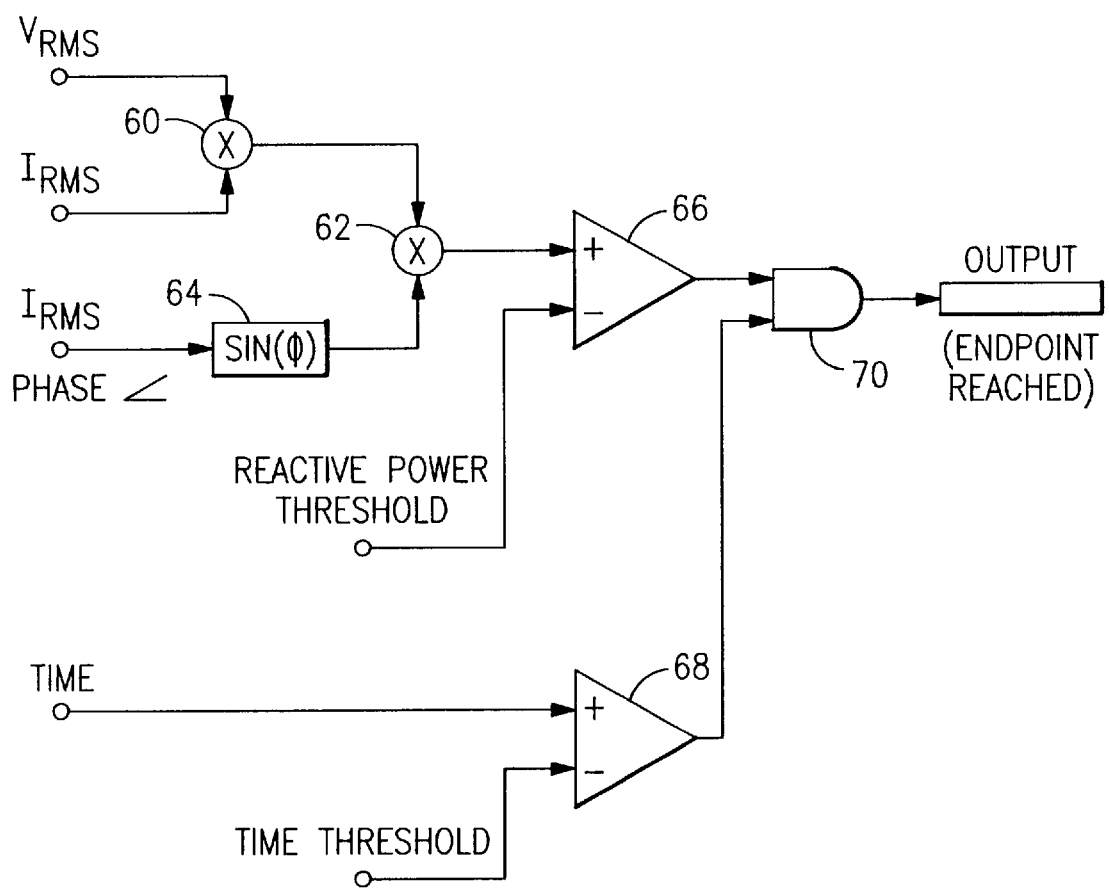
FIG. 6 is a schematic block diagram of a control algorithm, for explaining the invention.

FIG. 6 illustrates a schematic block diagram of the control function as generated by a user. Here the control algorithm for this example is formed by dragging and dropping inputs, operators, and outputs from the library, and connecting their respective input and output nodes. Here, the inputs $V_{rms}$ and $I_{rms}$ are selected, together with phase angle $\Phi$. There are two multiplication operators 60, 62, a sine operator 64, two comparator operators 66, 68, and an AND gate 70. The rms voltage and current are multiplied together and then their product is multiplied by the sine of the phase angle $\Phi$ to obtain a computation of the reactive power. This value is compared with a selected threshold value. Elapsed time is compared with a time threshold value, and the outputs of the two comparators 66, 68 are fed to inputs of the AND gate 70, whose output drives the Endpoint-Reached output 72. As is understood by those of skill in the art, each of the graphic icons corresponds to a block of code that carries out the function, digitally, represented by the icon. By selecting and connecting these building blocks or icons, the user is in effect creating code out of the corresponding code blocks. The software in the modular encoding system then automatically edits and debugs the code, which is downloaded to the code memory 30 of the PDS controller 26. A test run of the plasma etch process can now be conducted, allowing the user to evaluate the endpoint detection scheme. If any changes are necessary for the algorithm, the algorithm can be easily changed or the threshold values raised or lowered, using the external computer. The time involved in changing the algorithm is only a few minutes, and does not require any technical software assistance.

Figure 7:
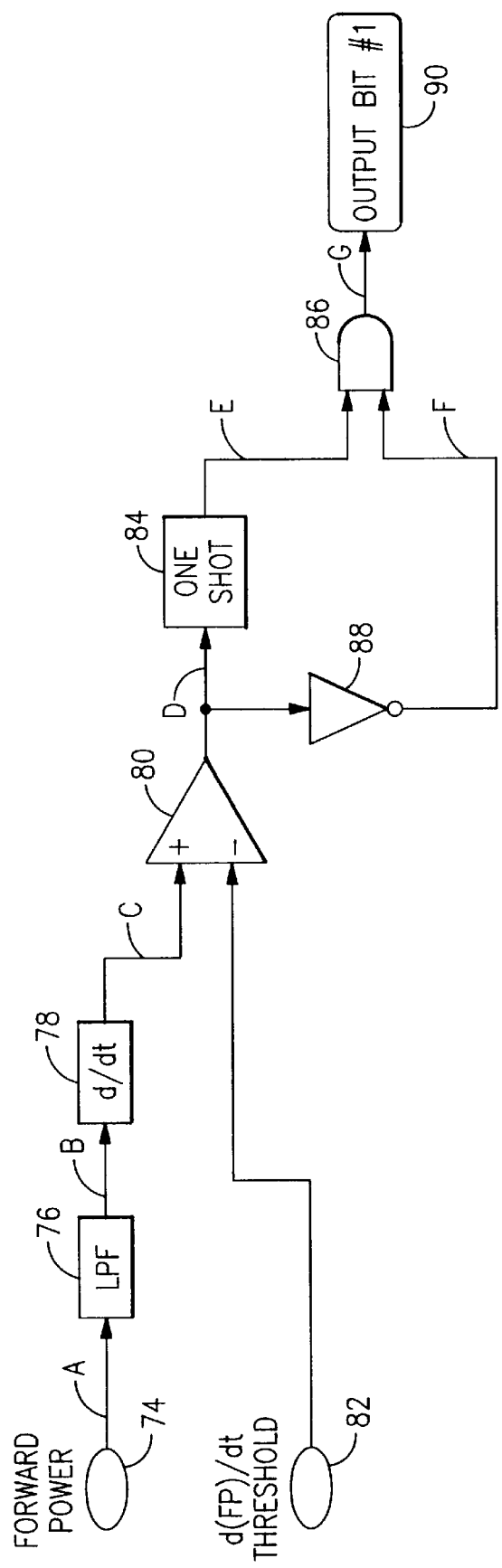
FIG. 7 is a schematic block diagram of another possible control algorithm.

Another, more complex algorithm for control of a practical plasma process is illustrated in FIG. 7, with additional reference to FIGS. 8A to 8G. The letters A to G associated with the FIGS. 8A to 8G correspond to the signal at circuit points indicated by those letters in FIG. 7. Here, the principal operating parameter of interest is the forward power, which can be obtained directly from the V/I sensor system 16. In this algorithm, the block diagram is created as shown in FIG. 7, with a forward power input 74 connected to a low pass filter block 76, which is then followed by a differentiator block 78, whose output is connected to one input of a comparator 80.

A threshold value input 82 is connected to the other input of the comparator 80. The output of the comparator 80 is connected to a one-shot 84, that feeds one input of an AND gate 86. The output of the comparator is also connected to an inverter or NOT 88, whose output connects to the other input of the AND gate 86. The output of the AND gate is connected to an output 90, which controls the generator 12.

Figure 8A:
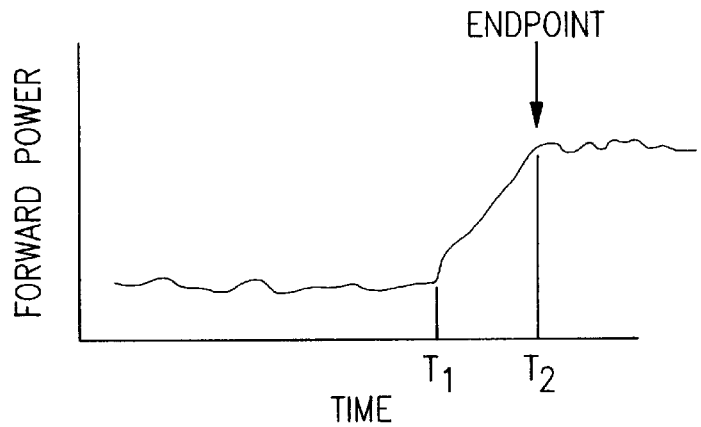
FIGS. 8A to 8G are charts for explaining the operation of the control algorithm of FIG. 7.
Figure 8B:
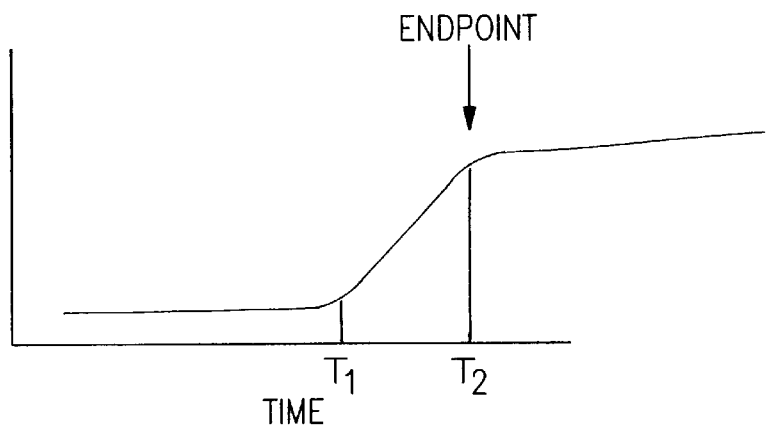
Figure 8C:
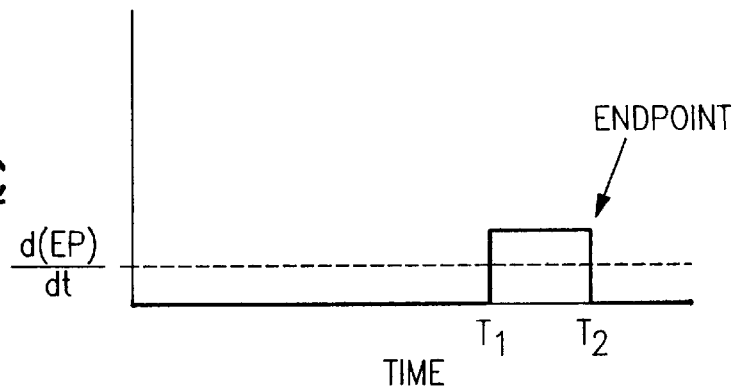
Figure 8D:
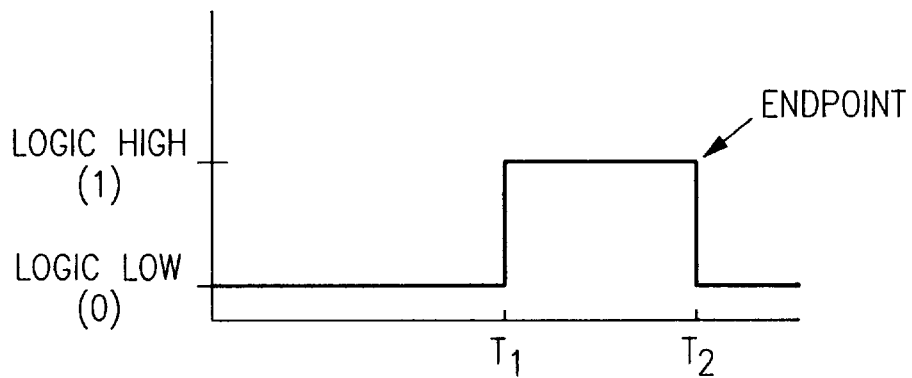
Figure 8E:
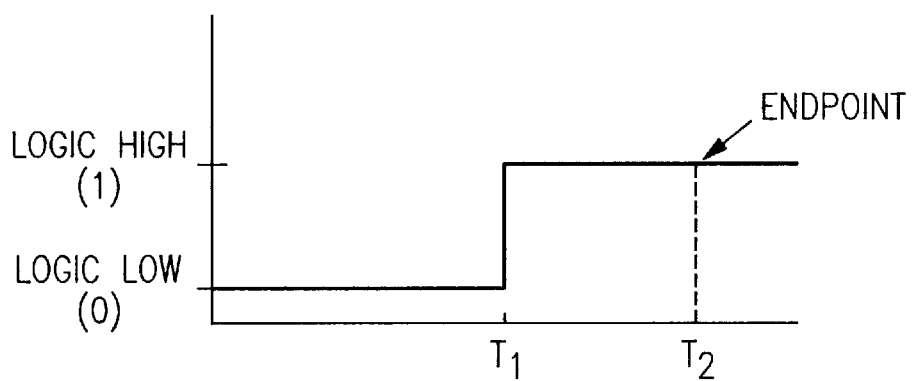
Figure 8F:
Figure 8G:
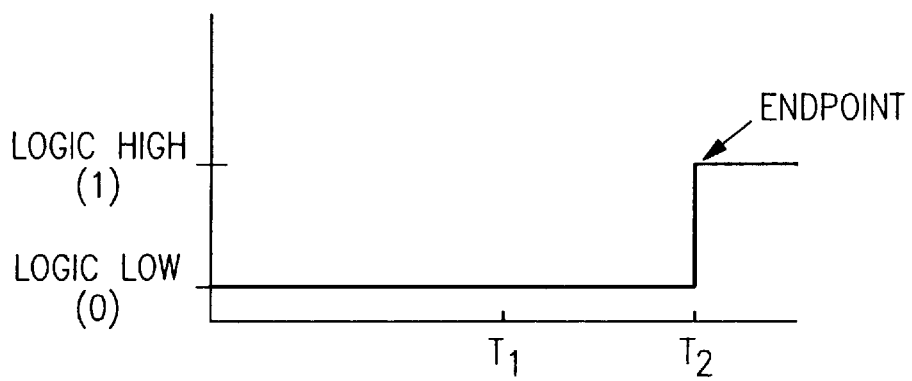

The forward power appears at point A in FIG. 7 as a time variant level, as shown in FIG. 8A. The forward power remains at a relatively low level from the commencement of plasma operations (at time $T_0$) until a first critical point is reached at time $T_1$. Then the forward power rises with time until a second critical time $T_2$, after which it remains at a second, higher level. This knee of the forward power curve at Time $T_2$ is selected as the end point. The small variations in the power level are smoothed out at the LPF stage 76, as shown in FIG. 8B. The output of the differentiator 78 (FIG. 8C) goes high at time $T_1$ and then goes back to a low at time $T_2$. The differentiator output is compared with a reference level in comparator 80 which generates a square signal (FIG. 8D) going low to high at $T_1$ and high to low at $T_2$. One-shot 84 produces a logic signal (FIG. 8E) that is low prior to $T_1$ and then high after $T_1$, while NOT or inverter 88 produces a logic signal (FIG. 8F) that is the inverse of the FIG. 8D signal. The digital signals of FIGS. 8E and 8F are applied to inputs of the AND gate 86, so that the output of the AND gate applies to the output 90 an End Point signal as appears in FIG. 8G. The actual positions of times $T_1$ and $T_2$ will vary in dependence on plasma conditions, but this scheme will reliably find the exact endpoint. The corresponding code is then stored in the memory device 30, and can be recalled whenever the same type of plasma application is used. The code can be easily uploaded back to the computer 36 and revised without difficulty to effect changes or corrections to the control algorithm. Also, as mentioned above, a number of control algorithms can be stored, which would be used for controlling different respective plasma process operations.

The user can commence a plasma operation controlled using this algorithm. During the test run, the user can simply click on circuit test points on the computer monitor 46, and the computer will display the value of the parameter at a given input or output. For example by clicking on the output of the differentiator 78 to obtain a real-time value of the differentiator output corresponding to FIG. 8C. The process values are continuously uploaded from the controller to the computer during the run. This facilitates testing of the control algorithm, so that any corrections or changes to it can be effected during, or immediately after the test run.

It should be appreciated that different logic processing could arrive at the same results, e.g., involving a J–K flip-flop, or other available logic, arithmetic, or other operators available in the icon library.

The operators represented by icons on the monitor screen may be connected by dragging a cursor using a mouse or similar device, or may be connected at the keyboard using node numbers assigned by the user to tie the circuit points together. Also, the program has the capability of adding user-created operator icons.

Moreover, with this invention it is possible to control the equipment directly without having to go through a system controller. For example, a closed loop control from a probe at the input to the plasma chamber to an RF generator can incorporate this system independent of the system controller 26.

While the invention has been described with reference to selected preferred embodiments, it should be understood that those embodiments were intended to provide a practical example, and not to limit the scope or spirit of the invention. The invention has applications outside plasma processes as well, wherever a controlled RF or DC current is to be applied to effect some physical or chemical change of a material or workpiece. Rather, many modifications and variations will be apparent to those of skill in the art without departing from the scope of this invention, which can be ascertained with reference to the appended claims.

We claim:

1. Plasma process control arrangement wherein a plasma generator means provides electrical power to a plasma chamber for conducting a plasma process at a controlled level, said electrical power having detectable operating parameters including voltage and current levels, and in which a programmable detection system detects said operating parameters; said control arrangement comprising a programmable PDS controller including input means coupled to said programmable detection system to receive said operating parameters therefrom, a programmable memory unit for storing a control program to determine an output control signal based on said operating parameters, said control program defining said detection of said operating parameters, and a control output coupled to a control input of said plasma generator means; an external computer device including a monitor, an icon copying device, and a memory storing a suitable code-building program for generating a user-defined control program; and means for loading the user-defined control program from the external computer device to the programmable memory of said programmable PDS controller, said user-defined control program comprising means for modifying the operation of said programmable PDS controller by defining said detection of said operating parameters according to said user-defined process requirements.

2. The plasma process control arrangement of claim 1, wherein said graphical icons include arithmetic operators.

3. The plasma process control arrangement of claim 1, wherein said graphical icons include logic operators, trigonometric operators, and signal processing operators.

4. The plasma process control arrangement of claim 1 wherein said control output includes an endpoint signal, and wherein said plasma generator means is operative to cease providing said electrical power in response to said endpoint signal.

5. The plasma process control arrangement of claim 1 wherein said external computer device comprises means for uploading performance data from the PDS controller into the computer, and said computer is operative for testing and debugging said control program while the process is being conducted.

6. The plasma process control arrangement of claim 1 comprising a sensor coupled to said generator for monitoring an additional operating parameter associated with said generator, and means connecting said sensor to an input of said PDS controller.

7. The plasma process control arrangement of claim 1 comprising a sensor coupled between said plasma generator and said chamber for monitoring a predetermined operating parameter of said plasma, and means for connecting said sensor to an input of said PDS controller.

8. The plasma process control arrangement of claim 1 wherein said icon copying device includes means for dragging and dropping said icons on said monitor.

9. RF plasma control arrangement wherein an RF plasma generator means provides RF electrical power to an RF plasma chamber for carrying out a plasma process at a controlled level, said electrical power having detectable operating parameters including voltage level, current level, and phase angle, and in which a programmable detection system detects said operating parameters; said control arrangement comprising a programmable PDS controller including input means coupled to said programmable detection system to receive said operating parameters therefrom, a programmable memory unit for storing a control program to determine an output control signal based on said operating parameters, said control program defining said detection of said operating parameters, and a control output coupled to a control input of said plasma generator means; an external computer device including a monitor, an icon copying device, and a memory storing a suitable code-building program for generating a user-defined control program according to user-defined process requirements, wherein respective graphical icons are presented on the monitor and are selected and connected by said program to represent logic processing of said operational parameters, and said external computer device creates the corresponding user-defined control program; and means for loading the user-defined control program from the external computer device to the programmable memory of said programmable PDS controller said user defined control program comprising means for modifying the operation of said programmable PDS controller by defining said detection of said operating parameters according to said user-defined process requirements.

10. The RF plasma process control arrangement according to claim 9 wherein said detection system includes a voltage-current probe providing outputs signals representing RMS voltage level, RMS current level and phase angle between applied voltage and current at the plasma chamber.

11. The RF plasma process control arrangement according to claim 9 wherein said graphical icons include logic operators, trigonometric operators, and arithmetic operators.

12. The RF plasma process control arrangement according to claim 9 wherein said graphical icons include signal processing and feedback operators.

13. The RF plasma control arrangement according to claim 9 wherein said programmable memory is a non-volatile memory.

14. An RF plasma process control arrangement wherein an RF plasma generator means provides RF electrical power to an RF plasma chamber for carrying out an RF plasma process at a controlled level, said RF electrical power having detectable operating parameters including voltage level, current level, and phase angle, wherein an impedance match network is interposed between said plasma generator means and said plasma chamber, said match network including error detector means for detecting differences between electric levels and phase angles at said plasma chamber, and including at least one variable impedance and means for adjusting the value of said variable impedance, and in which a programmable detection system interposed between said match network and said chamber detects said operating parameters; said control arrangement comprising a programmable PDS controller including input means coupled to said programmable detection system to receive said operating parameters therefrom, a programmable memory unit for storing a control program to determine an output control signal based on said operating parameters, said control program defining said detection of said operating parameters a first control output coupled to a control input of said plasma generator means; an external computer device including a monitor, a drag-and-drop device, and a memory storing a suitable code-building program for generating a user-defined control program according to user-defined process requirements, wherein respective graphical icons are presented on the monitor and are selected and connected by use of the drag-and-drop device to represent logic processing of said operational parameters, and said external computer device creates the corresponding user-defined control program; and means for loading the user-defined control program from the external computer device to the programmable memory of said programmable PDS controller, said user-defined control program comprising means for modifying the operation of said programmable PDS controller by defining said detection of said operating parameters according to said user-defined process requirements.

15. The RF plasma process control arrangement of claim 14, wherein said PDS controller includes a second control output coupled to the means for adjusting the value of said variable impedance.

16. An RF plasma process control arrangement wherein an RF plasma generator means provides RF electrical power to an RF plasma chamber for carrying out an RF plasma process at a controlled level, said RF electrical power having detectable operating parameters including voltage level, current level, and phase angle, wherein at least one detector is coupled with said generator and said chamber to monitor operating conditions therein, and in which a programmable detection system detects said operating parameters; said control arrangement comprising a programmable PDS controller including first input means coupled to said programmable detection system to receive said operating parameters therefrom, second input means coupled to said at least one detector, a programmable memory unit for storing a control program to determine an output control signal based on said operating parameters, said control program defining said detection of said operating parameters, a first control output coupled to a control input of said plasma generator means; an external computer device including a monitor, an icon copying device, and a memory storing a suitable code-building program for generating a user-defined control program according to user-defined process requirements, wherein respective graphical icons are presented on the monitor and are selected and connected by use of the icon copying device to represent logic processing of said operational parameters, and said external computer device creates the corresponding user-defined control program; and means for loading the user-defined control program from the external computer device to the programmable memory of said programmable PDS controller, said user-defined control program comprising means of modifying the operation of said PDS programmable controller by defining said detection of said operating parameters according to said user-defined process requirements.

17. Industrial process control arrangement wherein a power generator means provides electrical power for conducting an industrial process at a controlled level, said electrical power having detectable operating parameters including voltage and current levels, and in which a detection system detects said operating parameters; said control arrangement comprising a programmable PDS controller including input means coupled to said programmable detection system to receive said operating parameters therefrom, a programmable memory unit for storing a control program to determine an output control signal based on said operating parameters, said control program defining said detection of said operating parameters, and a control output coupled to a control input of said generator means; an external computer device including a monitor, an icon copying device, and a memory storing a suitable code-building program for generating a user-defined control program according to user-defined process requirements; and means for loading the user-defined control program from the external computer device to the programmable memory of said programmable PDS controller, said user-defined control program comprising means for modifying the operation of said programmable PDS controller by defining said detection of said operating parameters according to said user-defined process requirements.

18. The industrial process control arrangement of claim 17, wherein said external computer includes means for selecting any of said icons during operation of said industrial process and wherein said computer monitor indicates the process operating parameter corresponding to the selected icon.

* * * * *